(12) United States Patent
Iwane et al.

(10) Patent No.: US 7,525,284 B2
(45) Date of Patent: Apr. 28, 2009

(54) CHARGING RATE ESTIMATING METHOD, CHARGING RATE ESTIMATING UNIT AND BATTERY SYSTEM

(75) Inventors: Noriyasu Iwane, Tokyo (JP); Yuichi Watanabe, Tokyo (JP); Takezo Sugimura, Tokyo (JP); Toshiyuki Satoh, Tokyo (JP); Atsushi Kimura, Tokyo (JP); Fumikazu Iwahana, Tokyo (JP); Katsumi Inaniwa, Yokohama (JP); Tetsuya Kanou, Yokohama (JP)

(73) Assignee: The Furukawa Electric Co., Ltd, Tokyo (JP)

( * ) Notice: Subject to any disclaimer, the term of this patent is extended or adjusted under 35 U.S.C. 154(b) by 302 days.

(21) Appl. No.: 10/552,674

(22) PCT Filed: Jul. 8, 2004

(86) PCT No.: PCT/JP2004/009749

§ 371 (c)(1),
(2), (4) Date: Apr. 24, 2006

(87) PCT Pub. No.: WO2005/006006

PCT Pub. Date: Jan. 20, 2005

(65) Prior Publication Data

US 2006/0208704 A1    Sep. 21, 2006

(30) Foreign Application Priority Data

Jul. 9, 2003   (JP) .............................. 2003-194655
Mar. 11, 2004  (JP) .............................. 2004-069762

(51) Int. Cl.
*H02J 7/00* (2006.01)
*H02J 7/14* (2006.01)
*G01N 27/416* (2006.01)

(52) U.S. Cl. ...................... 320/132; 320/104; 320/134; 320/136; 324/427; 324/435

(58) Field of Classification Search ................. 320/104, 320/132, 134, 136; 324/427, 435
See application file for complete search history.

(56) References Cited

U.S. PATENT DOCUMENTS

| 4,460,870 A * | 7/1984 | Finger ........................ 324/429 |
| 2002/0113594 A1* | 8/2002 | Satake ........................ 324/427 |

FOREIGN PATENT DOCUMENTS

JP    03-158781    7/1991

(Continued)

OTHER PUBLICATIONS

EPO Communication pursuant to Article 96(2) EPC dated Oct. 10, 2006.

*Primary Examiner*—Akm E Ullah
*Assistant Examiner*—Johali A Torres Ruiz
(74) *Attorney, Agent, or Firm*—Knoble Yoshida & Dunleavy, LLC

(57) ABSTRACT

The method for calculating charged rate of a secondary battery is intended to calculate charged rate of a secondary battery which supplies electric power to loads, and comprises the step to measure voltage of the secondary battery more than once in a predetermined period of time after termination of charge or discharge, the step to determine the coefficients of a quadric or more exponential damping function which approximates the time characteristic of the open circuit voltage of the secondary battery by recursive calculation with the plural measured voltage values, and the step to calculate a convergent value of the open circuit voltage of the secondary battery from at least the exponential damping function with the coefficients determined above.

Therefore, precise charged rate of the secondary battery can be calculated from the precise convergent value of the open circuit voltage.

16 Claims, 12 Drawing Sheets

FOREIGN PATENT DOCUMENTS

| | | |
|---|---|---|
| JP | 07-98367 | 4/1995 |
| JP | 07098367 A * | 4/1995 |
| JP | 2002-234408 | 8/2002 |
| JP | 2002-250757 | 9/2002 |

* cited by examiner

CHARGING RATE ESTIMATING METHOD, CHARGING RATE ESTIMATING UNIT AND BATTERY SYSTEM

RELATED APPLICATION DATA

This application is a 35 U.S.C. §371 continuation application of international application No. PCT/JP2004/009749, filed on Jul. 8, 2004, the entire content of which is hereby incorporated by reference.

FIELD OF THE INVENTION

The present invention relates to a method and apparatus for calculating charged rate of a secondary battery which is employed to supply loads with electric power.

BACKGROUND OF THE INVENTION

In a secondary battery for backup or power supply in various types of equipments, or such automotive battery as lead storage battery, it has long been required to exactly determine a remaining electrical charge. In a secondary battery, since the charged rate in general correlates with an open circuit voltage, it is possible to calculate the charged rate from the open circuit voltage. However, it is necessary to measure the open circuit voltage under the condition in which neither charge nor discharge is executed. In addition, it takes long time until the open circuit voltage becomes stable after finishing the charge or discharge. Thus, various methods are proposed for measuring the open circuit voltage in a short time of the secondary battery under the specific condition to obtain a convergent value of the open circuit voltage based on a function approximating time characteristic of the open circuit voltage. (For instance, refer to JP07-098367, JP2002-234408 and JP2003-075518)

SUMMARY OF THE INVENTION

When a convergent value of the open circuit voltage in a secondary battery is calculated by means of the conventional methods as mentioned above, the preciseness of the convergent value depends on the function employed in the approximate calculation. In general, a function with time parameters such as polynomial function or logarithm function is employed to calculate the convergent value of the open circuit voltage. However, it is difficult to precisely approximate the time characteristics of the open circuit voltage with the use of the functions as mentioned above. As the result, the convergent value calculated with the use of the approximate calculation includes relatively large errors. Therefore, there is a problem in which the charged rate calculated by means of the conventional method is not precise since the approximate calculation has a limitation to obtain highly preciseness so as to calculate improper charged rate.

One of the purpose of the present invention is to provide a method for calculating charged rate of a secondary battery which makes it possible to calculate a precise convergent value of the open circuit voltage in a short period of time, and thereby to calculate a precise charged rate.

In order to achieve the above object, the method for calculating charged rate of a secondary battery according to the first aspect of the present invention is intended to calculate charged rate of a secondary battery which is adapted to supply electric power to load to a load, and comprises the steps of: providing a time function for the open circuit voltage of the secondary battery as a function of time with its coefficients undetermined; measuring voltages samples of the open circuit voltage of the secondary battery at a plurality of different time points within a predetermined period of time after termination of charge or discharge to obtain plural measured voltage samples along time axis; using the plural measured voltage samples to determine the coefficients of the time function to thereby determine the time function; calculating a convergent value of the open circuit voltage of the secondary battery based on the determined time function; and calculating the charged rate based on the convergent value of the open circuit voltage; wherein the step of providing the time function comprises providing a combination of at least two exponential decay functions in which the combination of N exponential decay functions, hereinafter referred to as multi-exponential decay function, where N is an integer of at least two is given by $$Y = a1\exp(-b1 \cdot X) + a2\exp(-b2 \cdot X) + a3\exp(-b3 \cdot X) + a4\exp(-b4 \cdot X) + \ldots + an\ \exp(-bn \cdot X) + c \qquad (12)$$

wherein (2N+1) coefficients a1 to an, b1 to bn and c are undetermined, Y denotes the open circuit voltage, and X denotes time; and wherein the step of using the plural measured voltage samples comprises using the measured voltage samples to determine the (2N+1) coefficients to determine the multi-exponential decay function.

According to the first aspect of the present invention, the convergent value of the open circuit voltage of secondary battery is calculated resursively from plural of the voltage values measured more than once for the predetermined period after the termination of charge or discharge. In the aforementioned calculation, as the time characteristic of the open circuit voltage of the secondary battery is approximated with the quadric or more exponential damping function, the approximate calculation is extremely precise as compared to polynomial function or logarithm function. In addition, as the charged rate of a secondary battery is calculated from the calculated convergent value of the open circuit voltage, it is possible to calculate the more precise charged rate due to the precise approximation for the time characteristic of the open circuit voltage.

In the method for calculating charged rate of a secondary battery according to the second aspect of the present invention, wherein predetermined exponential decay terms included in the multi-exponential decay function are removed in correspondence to a standby time of measuring the plural measured voltage samples along the time axis to calculate the convergent value of the open circuit voltage of the secondary battery.

According to the second aspect of the present invention, along with the advantage of the method for calculating charged rate of a secondary battery according to the first aspect of the present invention, it is possible to reduce flexibly the order of the exponential damping function according to the precision of the calculation or the restriction from the system so that the computing process can be reduced.

In the method for calculating charged rate of a secondary battery according to the third aspect of the present invention, wherein the multi-exponential decay function is the function with time T as described below in the formula (1) which has five coefficients of A1, A2, A5, A6 and C:

$$F(T) = A1\exp(A5 \cdot T) + A2\exp(A6 \cdot T) + c \qquad (1)$$

wherein F(T) denotes the open circuit voltage.

According to the third aspect of the present invention, along with the advantage of the method for calculating charged rate of a secondary battery according to the first inspect of the present invention, it is possible to employ a conventional recursive calculation method to determine the five coefficients of A1, A2, A5, A6 and C including in the function F(T) so that it is possible to calculate the convergent value with the relative paucity of computing process.

In the method for calculating charged rate of a secondary battery according to the forth aspect of the present invention, wherein the multi-exponential decay function is the function with time T as described below in the formula (2) which has the nine coefficients of A1 to A9:

$$F(T) = A1\exp(A5 \cdot T) + A2\exp(A6 \cdot T) + A3\exp(A7 \cdot T) + A4\exp(A8 \cdot T) + A9 \quad (2)$$

According to the forth aspect of the present invention, along with the advantage of the method for calculating charged rate of a secondary battery according to the first inspect of the present invention, it is possible to employ a conventional recursive calculation method to determine the nine coefficients of A1 to A9 comprised in the function F(T) so that it is possible to steadily calculate the convergent value of the open circuit voltage with the relative paucity of computing process.

In the method for calculating charged rate of a secondary battery according to the fifth aspect of the present invention, the formula (3) mentioned below is used in place of the function F(T) of the formula (2) when the standby time of voltage measurement is more than or equal to a predetermined first time and less than a predetermined second time, the formula (4) mentioned below is used in place of the function F(T) of the formula (2) when the standby time of voltage measurement is more than or equal to the predetermined second time and less than a predetermined third time, and the formula (5) mentioned below is used in place of the function F(T) of the formula (2) when the standby time of voltage measurement is more than or equal to the predetermined third time:

$$F(T)=A2\exp(A6 \cdot T)+A3\exp(A7 \cdot T)+A4\exp(A8 \cdot T)+A9 \quad (3)$$

$$F(T)=A3\exp(A7 \cdot T)+A4\exp(A8 \cdot T)+A9 \quad (4)$$

$$F(T)=A4\exp(A8 \cdot T)+A9 \quad (5).$$

According to the fifth aspect of the present invention, along with the advantage of the method for calculating charged rate of a secondary battery according to the third aspect of the present invention, it is possible to reduce the order of the exponential damping function depending on the standby time of voltage measurement so that the computing process for calculating the charged rate is kept optimum in consideration of the required precision and the calculating time.

In the method for calculating charged rate of a secondary battery according to the sixth aspect of the present invention, the charged rate of at least one of two or more secondary batteries is calculated.

In the method for calculating charged rate of a secondary battery according to the seventh aspect of the present invention, the charged rates of at least two secondary batteries are calculated, and that there are comprised a display function which displays the charged rates of the secondary batteries and/or the determination of charge or replacement on each of the secondary batteries, or determination of ongoing use or not on the same, a storage function which records the history of the individual battery, and a control and judgment function with a program to record the history of the determination and/or to determine repeatedly.

An apparatus for calculating charged rate of a secondary battery according to the eighth aspect of the present invention, which is adapted to supply a load with electrical power, comprising a voltage sensor to measure voltage samples indicative of an open circuit voltage of the secondary battery at a plurality of different time points within a predetermined period of time after termination of charging or discharging; a control unit receive the measured voltage samples from the voltage sensor to calculate the charged rate;

wherein the control unit comprises a providing means for providing a combination of at least two exponential decay functions in which the combination of N exponential decay functions, hereinafter referred to as multi-exponential decay function, where N is an integer of at least two is given by $$Y = a1\exp(-b1 \cdot X) + a2\exp(-b2 \cdot X) + a3\exp*(-b3 \cdot X) + a4\exp(-b4 \cdot X) + \ldots + an\exp(-bn \cdot X) + c$$

wherein (2N+1) coefficients a1 to an, b1 to bn and c are undetermined, Y denotes the open circuit voltage, and X denotes time;

a function determining means for using the measured voltage samples to determine the coefficients of the multi-exponential decay function to thereby determine the multi-exponential decay function; and a charge determining means for calculating the charged rate of the secondary battery using at least the determined multi-exponential decay function, the charge determining means inluding means for determining a convergent value of the open circuit voltage using the determined multi-exponential decay function, and for calculating the charge rate using the determined convergent value of the open circuit voltage.

In the apparatus for calculating charged rate of a secondary battery according to the ninth aspect of the present invention, wherein the control unit further comprises means for simplifying the multi-exponential decay by removing a predetermined term in the multi-exponential decay function depending on a standby time of voltage measurement which is an elapsed time from termination of charge or discharge to starting to measure voltage, and means for applying the measured voltage samples to the simplified exponential decay function to determine its coefficients to determine the simplified exponential decay function in order that the convergent value of the open circuit voltage of the secondary battery may be calculated from the determined simplified exponential decay function.

In the apparatus for calculating charged rate of a secondary battery according to the tenth aspect of the present invention, wherein the multi-exponential decay function has five coefficients A1, A2, A5, A6 and C and is given by the formula (6):

$$F(T)=A1\exp(A5 \cdot T)+A2\exp(A6 \cdot T)+c \quad (6)$$

wherein T denotes time and F(T) denotes the open circuit voltage.

In the apparatus for calculating charged rate of a secondary battery according to the eleventh aspect of the present invention, the multi-exponential decay function has nine coefficients A1 to A9 and is given by the formula (7):

$$F(T) = A1\exp(A5 \cdot T) + A2\exp(A6 \cdot T) + \\ A3\exp(A7 \cdot T) + A4\exp(A8 \cdot T) + A9 \quad (7)$$

wherein T denotes time and F(T) denotes the open circuit voltage.

In the apparatus for calculating charged rate of a secondary battery according to the twelfth aspect of the present invention, the formula (8) mentioned below is used in place of the function F(T) of the formula (7) when the standby time of voltage measurement, which is the time from termination of charge or discharge for the secondary battery to starting the voltage measurement, is more than or equal to a predetermined first time and less than a predetermined second time, the formula (9) mentioned below is used in place of the function F(T) of the formula (7) when the standby time of voltage measurement is more than or equal to the predetermined second time and less than a predetermined third time, and the formula (10) mentioned below is used in place of the function F(T) of the formula (7) when the standby time of voltage measurement is more than or equal to the predetermined third time:

$$F(T)=A2\exp(A6\cdot T)+A3\exp(A7\cdot T)+A4\exp(A8\cdot T)+A9 \quad (8)$$

$$F(T)=A3\exp(A7\cdot T)+A4\exp(A8\cdot T)+A9 \quad (9)$$

$$F(T)=A4\exp(A8\cdot T)+A9 \quad (10).$$

In the apparatus for calculating charged rate of a secondary battery according to the eighth through the twelfth aspects of the present invention makes it possible to improve the reliability of an apparatus with a secondary battery.

In the apparatus for calculating charged rate of a secondary battery according to the thirteenth aspect of the present invention, the charged rate is calculated for at least one of two or more batteries.

In the apparatus for calculating charged rate of a secondary battery according to the fourteenth aspect of the present invention, the charged rates of at least two secondary batteries are calculated, and the apparatus comprises a display part which displays the charged rates of the secondary batteries and/or the determination of charge or replacement on each of the secondary batteries, or of ongoing use or not on the same, a storage part which records the histories of the individual batteries, and a control and judgment part with a program to record the histories of the determinations and/or to determine repeatedly.

The power supply system with secondary battery according to the fifteenth aspect of the present invention comprises the apparatus of calculating charged rate according to the eighth aspect of the present invention.

The power supply system according to the fifteenth aspect of the present invention is more reliable, more user-friendly and applicable to various fields.

The power supply system for vehicle with secondary battery according to the sixteenth aspect of the present invention comprises the apparatus for calculating charged rate of a secondary battery, and that the secondary battery is an automotive battery to supply loads on a vehicle with electric power.

The power supply system for vehicle with secondary battery according to the sixteenth aspect of the present invention is used for vehicle and calculates the charged rate of an automotive battery supplying loads on a vehicle with electric power. So the system is more reliable and more user-friendly.

As mentioned above, according to the present invention, there is provided the method for calculating charged rate of a secondary battery which calculates the convergent value of the open circuit voltage in a short period of time by approximating the time characteristic of the open circuit voltage of the secondary battery with a quadric or more exponential damping function.

DETAILED DESCRIPTION OF THE PREFERRED EMBODIMENTS

The preferable embodiments according to the present invention are described below with reference to the drawings.

The embodiments are described which are battery systems for vehicle having a function of calculating charged rate of the second battery for backup or power supply of various types of equipments, or second battery for vehicle with secondary battery mounted thereon.

Figure 1:
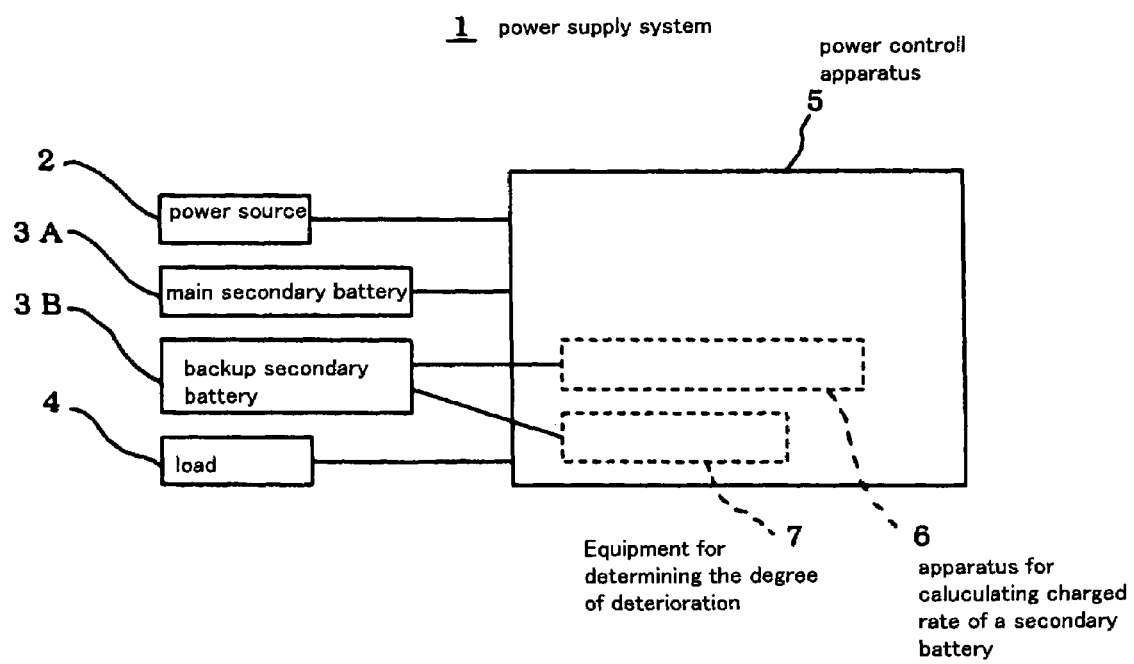
FIG. 1 is a block diagram showing the schematic construction of a power supply system according to an embodiment of the present invention.

FIG. 1 is a block diagram showing a schematic construction of a power supply system with secondary battery for power supply of various types of equipments, or for vehicle according to an embodiment. The system shown in FIG. 1 comprises at least two secondary batteries. The secondary battery 3A, one of at least two secondary batteries, is used as a main secondary battery, and the secondary batteries 3B, the other secondary batteries, are used as a backup secondary battery. The charged rate of at least one of the secondary batteries is calculated. For instance, solar battery or power source 2 for vehicle electric generator may be connected to the power control apparatus 5.

Both of the power control apparatus 5 and the apparatus 6 for calculating charged rate of a secondary battery in FIG. 1 may comprise a storage part which records the history of the individual battery not shown, and a control and judgment part to have a program to record the history of the determination of charge or replacement for secondary battery or of continuing use of secondary battery, and/or to determine repeatedly. In addition, the apparatus 6 may have also equipment for determining the degree of deterioration 7.

Moreover, the apparatus shown in FIG. 1 can inform users of the charged rates calculated for at least two secondary batteries, and/or information of the determination of charge or replacement on the secondary batteries, or information of continuous usability through (not shown) the cables attached to the individual connectors, or radio transmission, or through (not shown) display part.

The above-mentioned construction makes it possible to use at least one secondary battery at any time.

Figure 2:
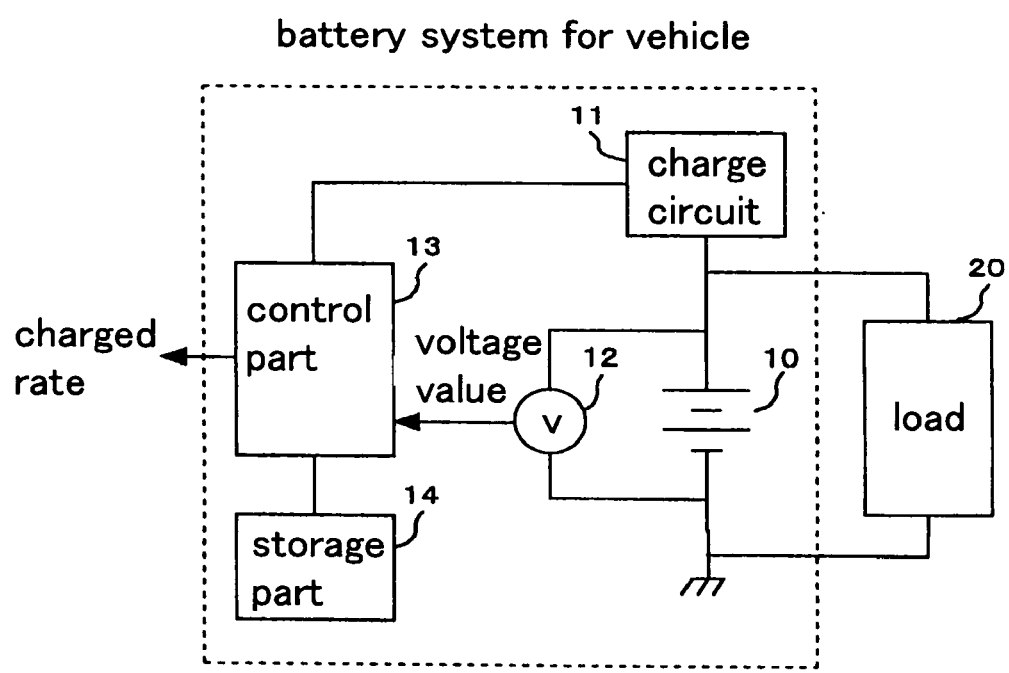
FIG. 2 is a block diagram showing the schematic construction of a power supply system for vehicle according to an embodiment of the present invention.

Next, FIG. 2 is a block diagram showing the schematic construction of a power supply system with secondary battery for vehicle according to an embodiment of the present invention. The power supply system with secondary battery for vehicle shown in FIG. 2 comprises the secondary battery 10, the charge circuit 11, the voltage sensor 12, the control part 13 and the storage part 14, and supplies electrical power to such loads as various equipments and motors on a vehicle from the secondary battery 10.

For example, a lead storage battery for vehicle is applied to the secondary battery 10 to supply electrical power to the load 20 mounted on a vehicle in FIG. 2. The charge circuit 11 supplies predetermined charge electrical current to charge the secondary battery 10 based upon the requirement for charge by the control part 13. The voltage sensor 11 measures the voltage between both terminals of the secondary battery 10, and transmits the measured voltage value to the control part 13.

The control part 13 comprises at least a CPU, executes the calculation process for calculating the charged rate as described below at the predetermined timings, along with the operation control of the whole power supply system with secondary battery for vehicle, and transmits the obtained charged rate to, for example, the control unit in a vehicle. Then, the storage part 14 connected to the control part 13 comprises ROMs where the various programs such as a control program are prestored, and RAMs where the datum required for the process in the control part 13 are stored temporarily.

Next, there is described the basis for calculating charged rate of a secondary battery in the power supply system with secondary battery for vehicle according to the embodiments of the present invention. As mentioned above, since charged rate of a secondary battery correlates closely with open circuit voltage of the secondary battery, the charged rate of the secondary battery is to be calculated from the open circuit voltage. However in many cases, voltage of secondary battery is affected by polarization due to frequent charge and discharge. It is necessary to measure a convergent value of the voltage under the condition of no polarization in order to calculate precisely the charged rate of the secondary battery. However, fading time of polarization phenomenon is extremely long such as from ten or more hours to some days. Therefore it is actually difficult to measure the open circuit voltage of secondary battery in stable state. Consequently in the embodiments of the present invention, there is used a function which can approximate precisely time characteristics of open circuit voltage, the coefficients of the function are determined by recursive calculation, and the convergent value of the open circuit voltage is immediately calculated based upon at least the determined coefficients.

In the present embodiments, it is assumed to use a quadratic or more exponential damping function to approximate the time characteristics of the open circuit voltage of the secondary battery 10. The formula (11) mentioned below is a general formula of quadratic exponential damping function.

$$Y = a1 \exp(-b1 \cdot X) + a2 \exp(-b2 \cdot X) + c \quad (11)$$

In the above formula, the numbers of a1, a2, b1, b2, c are shown as coefficients. In the formula (11), the parameter X is applied to the elapsed time after termination of charge or discharge, and the parameter Y is applied to the open circuit voltage. When all of the above coefficients are determined, it is possible to calculate approximately the open circuit voltage of the secondary battery 10 at any random time.

Furthermore, the formula (12) mentioned below is a general formula of n-th degree exponential damping function. The formula (12) is a formula to generalize the formula (11). In the formula (12), the numbers of a1, a2, ... , an, b1, b2, ... , bn, c are shown as coefficients. In the formula (12), the parameter X is applied to the elapsed time after completion of charge or discharge, and the parameter Y is applied to the open circuit voltage. When all of the above coefficients are determined, it is possible to calculate preciously the open circuit voltage of the secondary battery 10 at any random time.

$$Y = a1\exp(-b1 \cdot X) + a2\exp(-b2 \cdot X) + a3\exp(-b3 \cdot X) + \\ a4\exp(-b4 \cdot X) + \ldots + an \exp(-bn \cdot X) + c \quad (12)$$

When the open circuit voltage is approximated based on the formula (11) in the presents embodiments, the n being at least 2 makes sure of the certain degree of preciseness.

Moreover, when the open circuit voltage is approximated based on the formula (12), it is confirmed by way of experiment that the n being at least four makes sure of the practical degree of preciseness.

Figure 3:
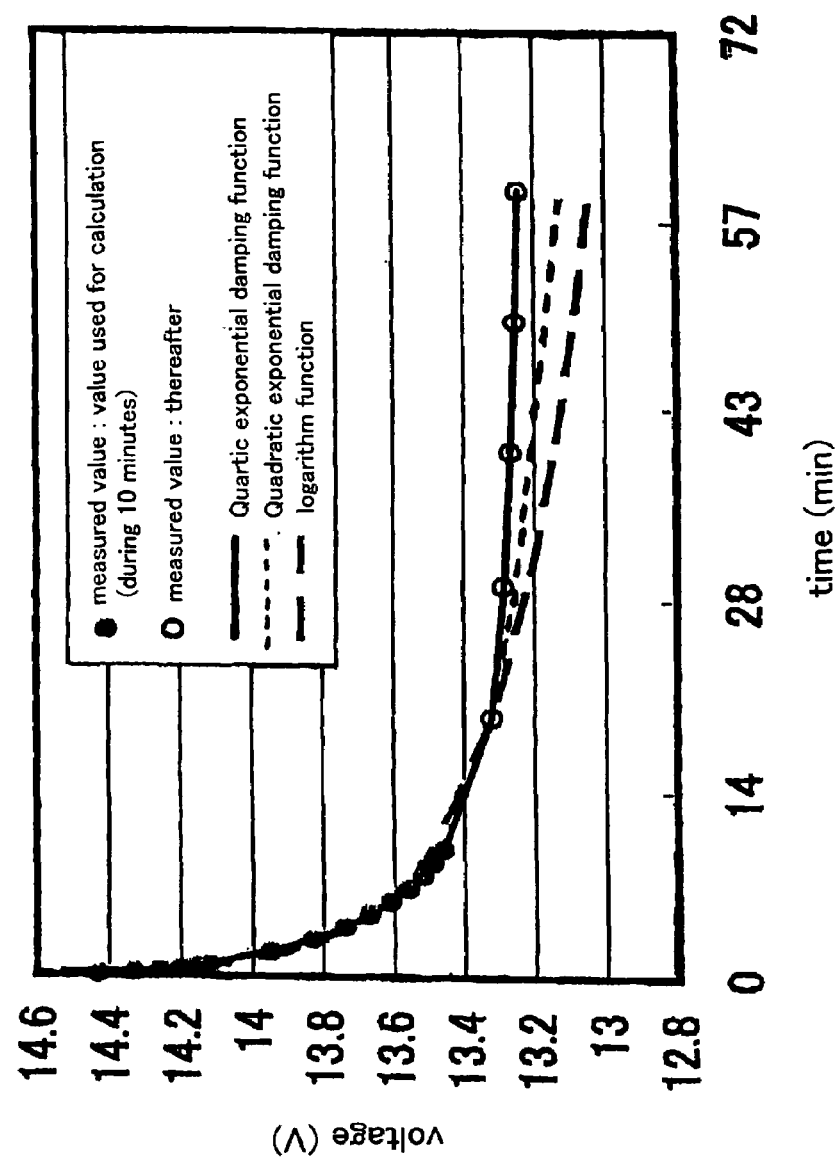
FIG. 3 shows a time characteristics of the open circuit voltage after termination of charge as a specific example of approximating the time characteristics with an exponential damping function.

FIG. 3 shows time characteristics of the open circuit voltage for sixty minutes after termination of charge, and a specific example of approximating the time characteristics with the use of a quartic exponential damping function. FIG. 3 shows, in addition, a conventional example as a comparative example of approximating the time characteristics with the use of a logarithm function, and the plotted actually measured values of the open circuit voltage of the secondary battery 10. When it comes to the above specific example, each coefficient of the exponential damping function is calculated from the measured values for ten minutes after termination of charge, to obtain as a result the formula (13). The specific example in FIG. 3 is calculated with the use of the formula (13):

$$Y = 1.80933 \exp(-X/4.65331) + 0.2895 \exp(-X/0.41691) - \\ 0.90055 \exp(-X/4.65129 + 0.9 \exp(-X/0.004) + 13.35703$$ (13)

Besides, when it comes to the comparative example in FIG. 3, the optimum coefficients of the conventional logarithm function are calculated under the condition similar to the specific example to obtain as a result the formula (14). The comparative example in FIG. 3 is calculated with the use of the formula (14).

$$Y=-0.2517 \ln(X)+14.072|$$ (14)

As shown in FIG. 3, the open circuit voltage calculated with the use of the conventional logarithm function is deviated from the plotted measured values, while the open circuit voltage calculation with the use of the quartic exponential damping function according to the present embodiments is substantially identical to the plotted measured values. Even the open circuit voltage calculated with the use of quadratic exponential damping function is less deviated than the open circuit voltage calculated with the use of the conventional logarithm function.

FIG. 3 indicates that when the open circuit voltage is calculated with the use of the conventional logarithm function, the deviations from the measured values get larger with the elapsed time after termination of charge or discharge, and considerably enlarge at the time in which the voltage of the secondary battery 10 converges roughly. And correlation coefficients between the measured values and the open circuit voltage values calculated with a conventional logarithm function and between the measured values and the open circuit voltage values calculated with the quartic exponential damping function according to the present embodiments are respectively calculated. As a result, squared R of the former is 0.9865, while that of the later is 0.99998. Therefore it is confirmed that a marked high preciseness of approximate calculation can be obtained due to the employment of a quartic exponential damping function. As described above, since the open circuit voltage can be precisely approximated with the use of the quartic exponential damping function compared to the approximate calculation with the conventional logarithm function, the preciseness of the calculation of the charged rate is remarkably improved. It is also possible to calculate the charged rate with the use of a quadratic or a tertiary exponential damping function depending on the required preciseness.

Figure 4:
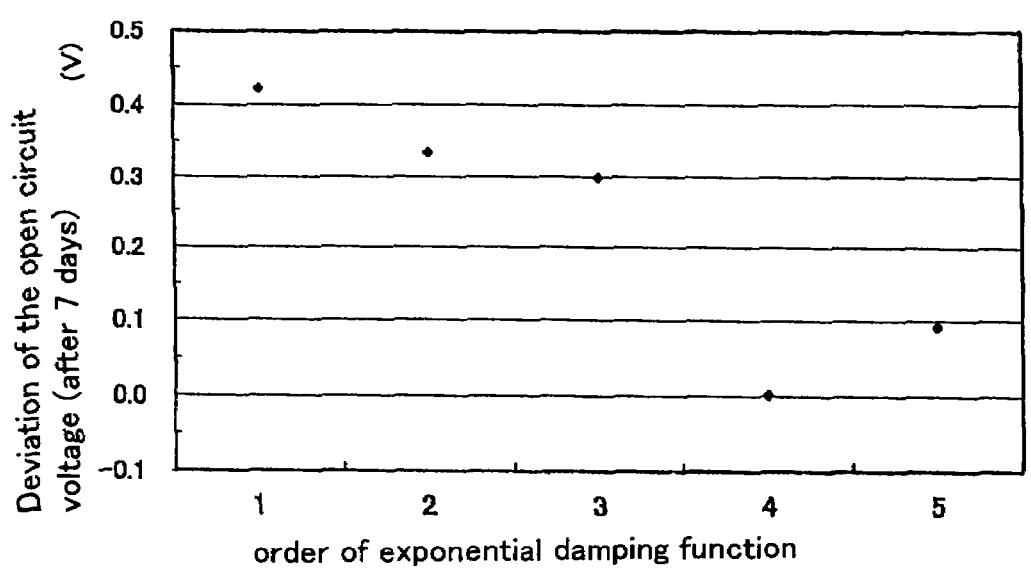
FIG. 4 shows the relation between the power number of the exponential damping function and the approximate precision in the case that the time characteristics of the open circuit voltage are approximated with the exponential damping function according to the embodiments of the present invention.

Next, there is described the relationship between the order of the above exponential damping function and the precision of the approximate calculation of the time characteristics of the open circuit voltage with reference to FIG. 4. In the n-th degree exponential damping function as shown in the formula (12), the time characteristics of the open circuit voltage values are calculated with the exponential damping functions having respectively proper coefficients for order n of 1 to 5 which are calculated from the time characteristic datum of voltage for 10 minutes after charging the secondary battery 10. FIG. 4 shows the deviation of the open circuit voltage values calculated for each order from the measured open circuit voltage values at seven days after termination of charge or discharge.

As FIG. 4 shows, in the exponential damping function as shown in the formula (12), a first-order function brings about the relative large deviation, quadratic and cubic functions bring about the acceptable deviations, and quartic and quintic functions bring about the sufficient precisions. Consequently, when the formula (12) is a quadratic or more function, the function brings about a certain level of precision, and furthermore when the formula 12 is a quartic or more function, the function brings about the sufficient precision steadily. In another respect, as mentioned below, in recursive calculation with an exponential damping function, it is necessary to keep as down computing process as possible. It is determined that the exponential damping function according to the present embodiments is a quartic function in consideration of the balance between accuracy and computing process as mentioned above.

Figure 5:
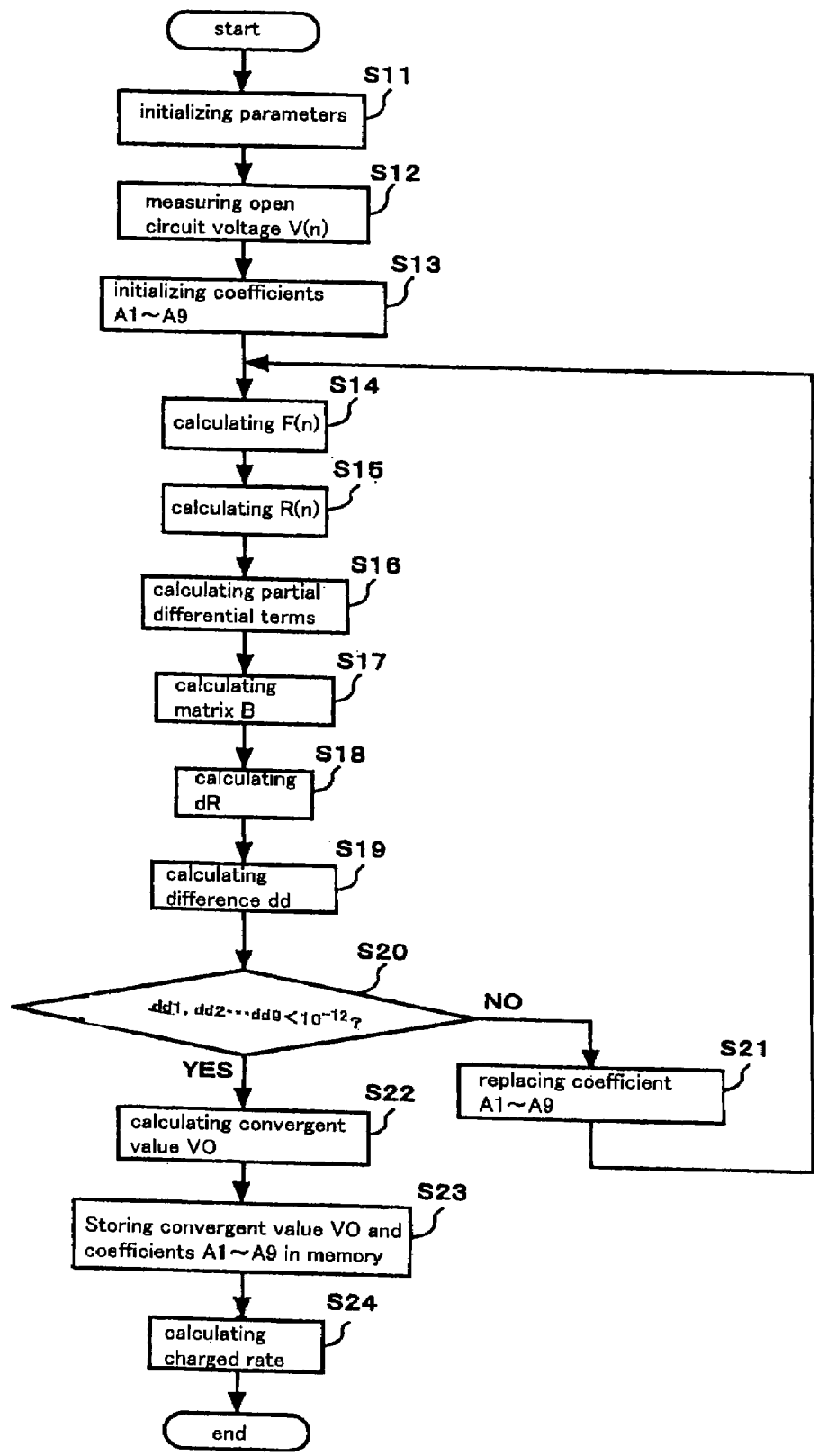
FIG. 5 is a flow chart to show the specific calculation process as to the calculation of the charged rate for a secondary battery in a power supply system for vehicle according to the embodiments of the present invention.

Next, the flowchart shown in FIG. 5 indicates a specific calculation process of calculating charged rates of a secondary battery in a power supply system with secondary batteries for vehicle according to the present embodiments. The calculation process in FIG. 5 is a process executed in the control part 13 based upon the control program stored in the storage part 14, and started at the predetermined timing after charging the secondary battery in the power supply system with secondary batteries for vehicle.

In the first step in the process shown in FIG. 5, the parameters to be necessary for the calculation in the control part 13 are initialized (Step S11). The parameters initialized in Step S11 are the sampling interval delta Ts and the sampling data number Ns in the voltage measurement of the secondary battery, and the time Tx required for the constant open circuit voltage of the secondary battery 10. For example, the delta Ts of ten seconds, the Ns of sixty and the Tx of one hundred thousands seconds can be employed as the initial values. It is possible to set the initial values to optimum values in consideration of the characteristics of the secondary battery, and also to replace the initial values by more proper values depending on operating state.

Next, the control part 13 starts to sample the voltage from the voltage sensor at the predetermined timing, and obtains plural of the sampling voltage values on time axis (Step S12). The sampling interval delta Ts and the sampling data number Ns in this step are set at the said Step S11. The control part 13 stores sequentially the sampling voltage values into the storage part 14, and reads out them as needed. In what follows, V(n) is decided as a n-th sampling voltage value measured in the Step S12.

Next, there are initialized the coefficients of the exponential damping function for approximation of the time characteristics of the open circuit voltage of the secondary battery 10 (Step S13). F(T) described below as the formula (15) is employed as this quartic exponential damping function:

$$F(T) = A1 \exp(A5 \cdot T) + A2 \exp(A6 \cdot T) + \\ A3 \exp(A7 \cdot T) + A4 \exp(A8 \cdot T) + A9 |$$ (15)

In the Step S13, the coefficients of A1 through A9 shown in FIG. 15 are set to the initial values which are prestored in the storage part 14. These coefficients are used to derive the optimum solution by least-square method, and as described later, the values of these respective coefficients are replaced sequentially in the computing process.

Next, as a result of substituting nTs for T in the above exponential damping function F(T), the function F(n) shown in the formula (16) is derived as for all of n:

$$F(n) = A1\exp(A5 \cdot n \cdot \Delta Ts) + A2\exp(A6 \cdot n \cdot \Delta Ts) + \\ A3\exp(A7 \cdot n \cdot \Delta Ts) + A4\exp(A8 \cdot n \cdot \Delta Ts) + A9 \quad (16)$$

In the Step S14, the number of F(n)s derived are Ns in total.

Next, the different values R(n)s between F(n)s derived in the Step S14 and measuring voltage values are calculated as for each n (Step S15). That is, the number of R(n)s calculated with the following formula (17) are Ns.

$$R(n) = F(n) - V(n) \quad (17)$$

Next, the partial differential terms of the respective coefficients of A1 through A9 are calculated to apply the least-square method (Step S16). In the Step S16, the partial differential of the respective coefficients of A1 through A9 described in the following formula (18) are calculated to each n.

$$\begin{aligned} dDFA1(n) &= \exp(A5 \cdot \Delta Ts \cdot n) \\ dDFA2(n) &= \exp(A6 \cdot \Delta Ts \cdot n) \\ dDFA3(n) &= \exp(A7 \cdot \Delta Ts \cdot n) \\ dDFA4(n) &= \exp(A8 \cdot \Delta Ts \cdot n) \\ dDFA4(n) &= A1 \cdot \Delta Ts \cdot n \cdot \exp(A5 \cdot \Delta Ts \cdot n) \\ dDFA5(n) &= A2 \cdot \Delta Ts \cdot n \cdot \exp(A6 \cdot \Delta Ts \cdot n) \\ dDFA4(n) &= A3 \cdot \Delta Ts \cdot n \cdot \exp(A7 \cdot \Delta Ts \cdot n) \\ dDFA4(n) &= A4 \cdot \Delta Ts \cdot n \cdot \exp(A8 \cdot \Delta Ts \cdot n) \end{aligned} \quad (18)$$

And the matrix B compatible with the simultaneous equations in the least-square method is calculated with the respective partial differential terms (Step S17). In particular, the matrix B described in the following formula (19) is calculated.

$$\begin{aligned} B(1,1) &= \sum_{n=1}^{Ns} \{dDFA1(n)\}^2 \\ B(1,2) &= \sum_{n=1}^{Ns} \{dDFA1(n) \times dDFA2(n)\} \\ B(1,3) &= \sum_{n=1}^{Ns} \{dDFA1(n) \times dDFA3(n)\} \\ &\vdots \\ B(9,9) &= \sum_{n=1}^{Ns} \{dDFA9(n)\}^2 \end{aligned} \quad (19)$$

The matrix B shown as the formula (19) is a square matrix of 9×9, and a symmetric matrix of B(x,y) equal to B(y,x).

Next, the dRs shown in the following formula (20) are calculated from the R(n)s calculated in the Step S15 and the partial differential term calculated in the Step S16 (Step S18).

$$\begin{aligned} dR1 &= -\sum_{n=1}^{Ns} \{dDFA1(n) \times R(n)\} \\ dR2 &= -\sum_{n=1}^{Ns} \{dDFA2(n) \times R(n)\} \\ dR3 &= -\sum_{n=1}^{Ns} \{dDFA3(n) \times R(n)\} \\ dR4 &= -\sum_{n=1}^{Ns} \{dDFA4(n) \times R(n)\} \\ dR5 &= -\sum_{n=1}^{Ns} \{dDFA5(n) \times R(n)\} \\ dR6 &= -\sum_{n=1}^{Ns} \{dDFA6(n) \times R(n)\} \\ dR7 &= -\sum_{n=1}^{Ns} \{dDFA7(n) \times R(n)\} \\ dR8 &= -\sum_{n=1}^{Ns} \{dDFA8(n) \times R(n)\} \\ dR9 &= -\sum_{n=1}^{Ns} \{dDFA9(n) \times R(n)\} \end{aligned} \quad (20)$$

Sequentially, the difference dds shown the following formula (21) are calculated from the matrix B calculated in the Step S17 and the dRs calculated in the Step S18 (step 19).

$$\begin{pmatrix} dd1 \\ dd2 \\ dd3 \\ dd4 \\ dd5 \\ dd6 \\ dd7 \\ dd8 \\ dd9 \end{pmatrix} = - \begin{pmatrix} B(1,1) & B(1,2) & B(1,3) & \ldots & B(1,9) \\ B(2,1) & B(2,2) & & & . \\ B(3,1) & B(3,2) & & & . \\ B(4,1) & & & & . \\ & & . & & \\ & & . & & \\ & & . & & \\ & & . & & \\ B(9,1) & & & & B(9,9) \end{pmatrix}^{-1} \begin{pmatrix} dR1 \\ dR2 \\ dR3 \\ dR4 \\ dR5 \\ dR6 \\ dR7 \\ dR8 \\ dR9 \end{pmatrix} \quad (21)$$

As mentioned above, there are calculated the differences of dd1 through dd9 respectively related to the coefficients of A1 through A9 in the Step S19. The optimum solution is calculated based upon the differences by least-square method.

Next, it is figured out if the nine differences of dd1 through dd9 calculated in the Step S19 meet the following formula (22)(step 20).

$$dd1, dd2, dd3, \ldots dd9 < 10^{-12} \quad (22)$$

It is possible to apply the predetermined values besides the minus twelfth power of ten, which make it possible to determine the left part of the formula 22 close to zero, to the right part. As a result of the determination, when it is determined that the formula 22 is effected (Step S20: Yes), each difference of dd1 through dd9 is enough close to zero. Therefore it is determined that the optimum solutions in the least-square method are obtained at the time. And next, the Step S22 is executed. To the contrary, when it isn't determined that the formula (22) is effected (Step S20: No), it is determined that any difference of dd1 through dd9 is not enough small, and that the optimum solutions are not obtained. In the case, the coefficients of A1 through A9 are replaced based upon the following formula (23)(Step S21).

$$\begin{pmatrix} A1 \\ A2 \\ A3 \\ A4 \\ A5 \\ A6 \\ A7 \\ A8 \\ A9 \end{pmatrix} = \begin{pmatrix} A1+dd1 \\ A2+dd2 \\ A3+dd3 \\ A4+dd4 \\ A5+dd5 \\ A6+dd6 \\ A8+dd7 \\ A8+dd8 \\ A9+dd9 \end{pmatrix} \quad (23)$$

After the coefficients of A1 through A9 are replaced, the process return to the Step S14, and the Step of S14 through S20 where the least-square method is applied are executed again.

When the process transfers from the Step S20 to the Step S22, the convergent value V0 which is a voltage value in the condition that the open circuit voltage keeps enough constant in the long term is calculated with the following formula (24)(step 22):

$$V0 = A1\exp(A5 \cdot Tx) + A2\exp(A6 \cdot Tx) + \quad (24)$$
$$A3\exp(A7 \cdot Tx) + A4\exp(A8 \cdot Tx) + A9$$

Next, both the convergent value of the open circuit voltage obtained in the Step S22 and the coefficients of A1 through A9 at the time are stored in the storage part 14 (Step S23). This process is executed, and the calculation of the open circuit voltage value in the stable condition is finished. Subsequently, it becomes possible to read out the open circuit voltage value in the stable condition from the storage part 14, and to apply it to such as the calculation of charged rate.

Next, the charged rate of the secondary battery 10 is calculated from the convergent value V0 of the open circuit voltage obtained in the Step S22 (step 24). In general, charged rate of a secondary battery is determined with convergent value V0 of open circuit voltage and a function including an ambient temperature as a parameter. Therefore, when the function applicable to the secondary battery 10 has been already determined, it is possible to calculate the charged rate of the secondary battery 10 by the calculation in the Step S24.

In a power supply system with secondary battery for vehicle according to the present embodiment, as described above, the charged rate of the secondary battery 10 calculated by the computing process shown in FIG. 5 is transmitted to such as a control apparatus in vehicle, and utilized in various pattern. For instance, when the charged rate is below a predetermined level, an alarm is indicated, or the charged rate at the time is displayed directly. As the computing process outputs precise values, precise charged rates are always calculated. In the result, there is provided a reliable and user-friendly power supply system with secondary battery for vehicle.

Next, there is described below another embodiment as an altered embodiment to be an alteration of the above embodiment. It is described above that time characteristics of the open circuit voltage is approximated by a quartic or more exponential damping function for precise recursive calculations as mentioned above in a power supply system with secondary battery for vehicle according to the present embodiment. However, even though a quartic or more exponential damping function is due to be used, some circumstances of the power supply system with secondary battery for vehicle makes also an exponential damping function with the order n of less than 4 applicable to the recursive calculation processes.

In this altered embodiment, when the process shown in FIG. 5 is executed, the differences between respective magnitudes of the effects of the terms of the exponential damping function occur depending on an elapsed time from termination of charge or discharge to starting to measure voltage (hereinafter called standby time of voltage measurement). Therefore, it is possible to employ the exponential damping function without some terms getting sufficiently lower with time. Hereinafter, there is described the case as a specific example in this altered example that a VRLA battery is applied to the secondary battery 10. In this specific example, there are determined the coefficients of the quartic exponential damping function to be optimized to the secondary battery 10, and the formula (25) is employed as an approximation formula in the recursive calculation:

$$Y = 1.01707\exp(-0.2328 \cdot T) + 0.38436\exp(-0.02577 \cdot T) + \quad (25)$$
$$0.15783\exp(-8.0717E-4 \cdot T) + 0.12104\exp$$
$$(-1.8876E-5 \cdot T) + 12.7216|$$

Figure 6:
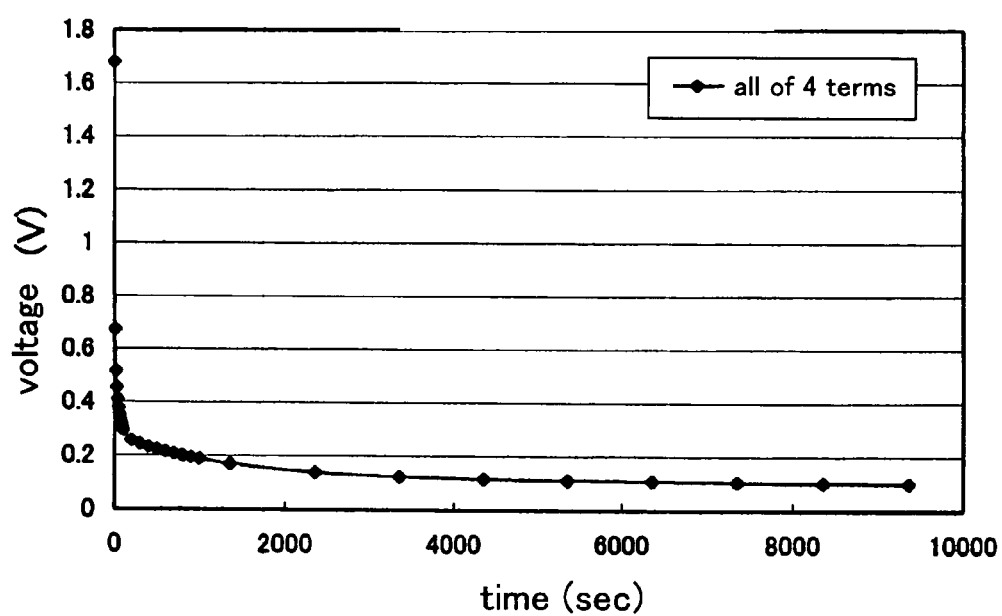
FIG. 6 shows the calculated time characteristics as a result of the approximate calculation with the quartic exponential damping function having all of the first through the forth terms.

The respective time characteristics of the open circuit voltages to the first through the fourth terms in the above formula (25) are analyzed. The results are shown in FIG. 6 through FIG. 10. At first, FIG. 6 shows the time characteristics including the elements of the first through the fourth terms of the formula (25) except constant term, and is calculated with the use of the following formula (26):

$$Y = 1.01707\exp(-0.2328 \cdot T) + 0.38436\exp(-0.02577 \cdot T) + \quad (26)$$
$$0.15783\exp(-8.0717E-4 \cdot T) + 0.12104\exp$$
$$(-1.8876E-5 \cdot T)|$$

FIG. 6 shows that as all elements of the terms dampen with time, the open circuit voltage converges to zero. But a change of the value of the formula 26 affects the oen circuit voltage value for a short period of time after starting the process.

Figure 7:
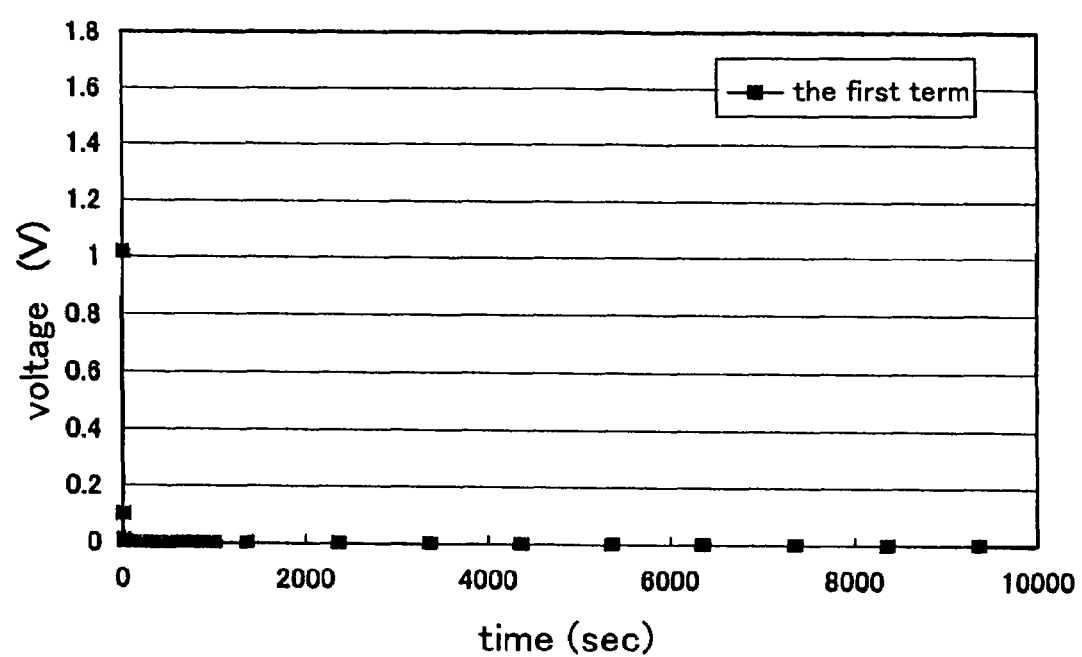
FIG. 7 shows the calculated time characteristics as a result of the approximate calculation with the quartic exponential damping function having only the first term.

Next, FIG. 7 shows the time characteristics of the only the first term of the formula (25), which are calculated with the use of the following formula (27):

$$Y = 1.01707 \exp(-0.2328 \cdot T) \quad (27)$$

Figure 8:
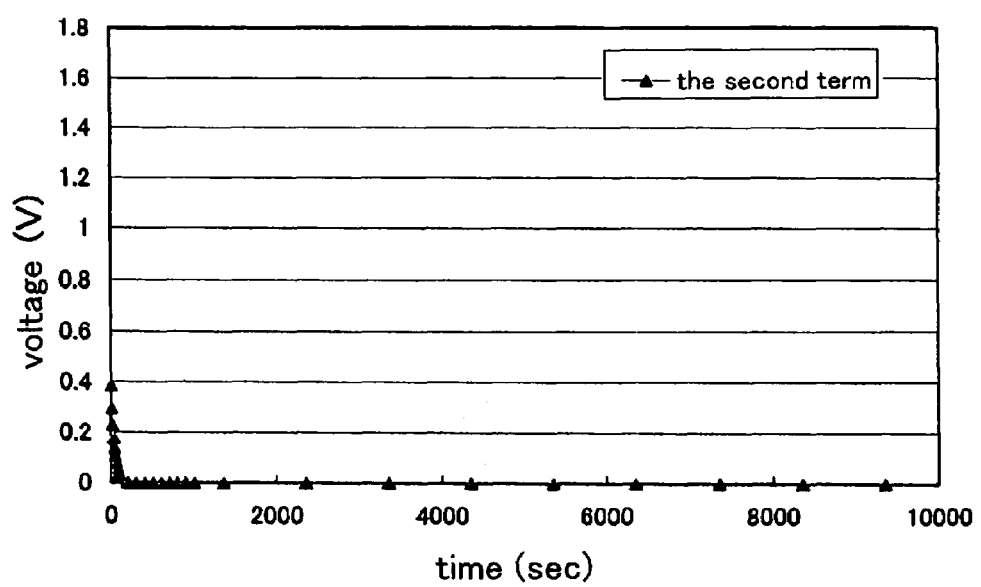
FIG. 8 shows the calculated time characteristics as a result of the approximate calculation with the quartic exponential damping function having only the second term.
Figure 9:
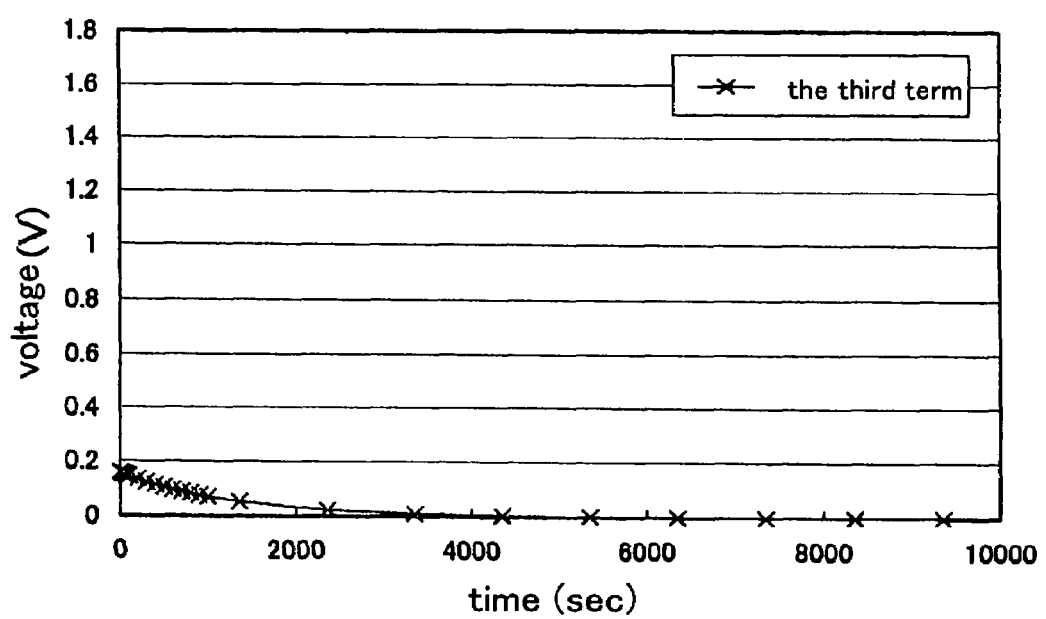
FIG. 9 shows the calculated time characteristics as a result of the approximate calculation with the quartic exponential damping function having only the third term.
Figure 10:
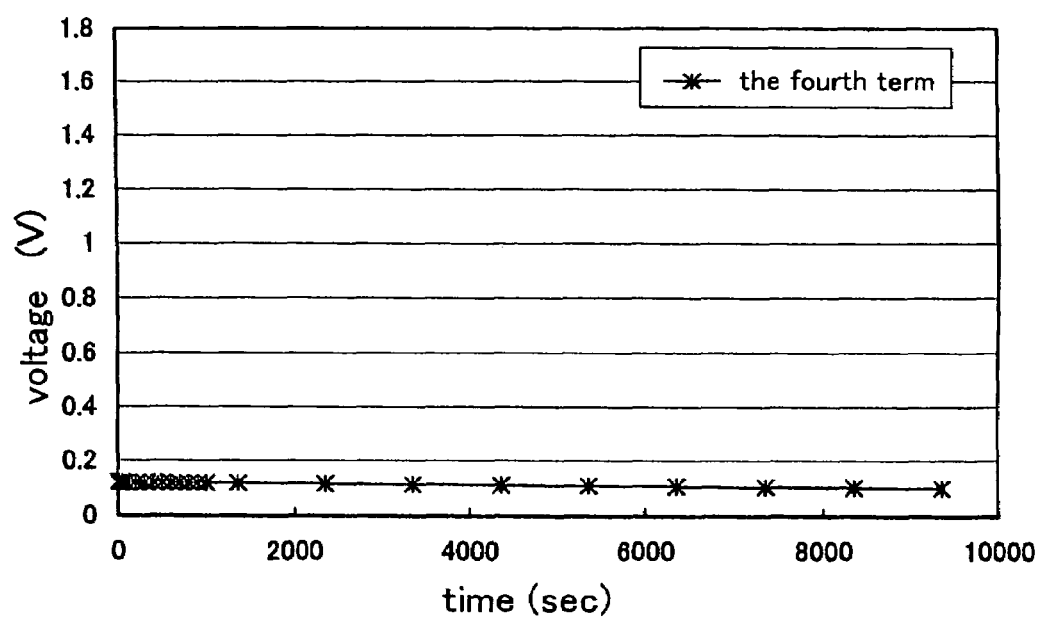
FIG. 10 shows the calculated time characteristics as a result of the approximate calculation with the quartic exponential damping function having only forth term element thereof.

By the same token, FIG. 8 shows the time characteristics of the only second term, FIG. 9 shows the time characteristics of the only third term, and FIG. 10 shows the time characteristics of the only fourth term. And FIGS. 8, 9 and 10 are calculated respectively with the formulae (28), (29) and (30):

$$Y = 0.38436 \exp(-0.02577 \cdot T) \quad (28)$$

$$Y = 0.15783 \exp(-8.0717E-4 \cdot T) \quad (29)$$

$$Y = 0.12104 \exp(-1.8876E-5 \cdot T) \quad (30)$$

As shown in FIG. 7 through FIG. 10, respective damping patterns of 1st through 4th terms are different from each other in initial stage of the each time characteristics, but are similar to each other in respect of converging to zero with time. The damping pattern of the first term shown in FIG. 7 is sharpest, and the damping patterns of the other terms are more gradual in the order corresponding to the second, the third and the fourth term. It is identified through comparison between FIG. 7 to FIG. 10 and Formula 27 to Formula 30 that the bigger a coefficient of the time parameter T of any term becomes, the shorter time a value of the term dampens in.

As there are the differences between damping patterns of the first through the fourth term in the exponential damping function of the present altered embodiment, the computing process is executed through the use of the formula without some predetermined terms by means of delaying starting voltage measurement in the measurement of the time characteristics of the open circuit voltage, and thereby it is possible to reduce the calculating processes.

TABLE 1

| standby time of voltage measurement (sec.) | applied terms of the quartic or more exponential damping function |
|---|---|
| 0~10 | $1^{st} + 2^{nd} + 3^{rd} + 4^{th}$ |
| 10~60 | $2^{nd} + 3^{rd} + 4^{th}$ |
| 60~600 | $3^{rd} + 4^{th}$ |
| 600~ | $4^{th}$ |

As shown in Table 1, when the standby time of voltage measurement is less than ten seconds, the exponential damping function includes the entire the first through the fourth terms. In the initial stage like this, as the ratios of the absolute values of the respective terms in the exponential damping function to the absolute value of the function are relatively large, it is necessary to calculate with all of the four terms to make sure of sufficient precision.

Unlike with the above, when the standby time of voltage measurement is more than 10 seconds, the first term of the exponential damping function gets lower in an ignorable degree, and therefore it is possible to use the exponential damping function except the first term. In addition, when the standby time of voltage measurement is more than 60 seconds, the second term of the exponential damping function also gets lower in an ignorable degree along with the first term, and therefore it is possible to use the exponential damping function except the first and the second terms. Furthermore, when the standby time of voltage measurement is more than 600 seconds, the third term of the exponential damping function also gets lower in an ignorable degree along with the first and second terms, and therefore it is possible to use the exponential damping function except the first through the third term.

Like this, as standby time of voltage measurement becomes longer, it is possible to substantially reduce the order of the exponential damping function, and to reduce calculation process. In this case, it is necessary to determine the employment of the every term of the exponential damping function under the condition that calculation precision in a recursive calculation meets a requirement. In the result of comparisons between the error tolerance, which is for instance set to 5%, and the respective ratios of the absolute value of the terms to the absolute value of the function, it is possible to remove some terms of which the ratios are less than the error tolerance.

In a power supply system with secondary battery for vehicle, some requirements on the system may also put a limit on the standby time of voltage measurement. More specifically in the power supply system, it is necessary to finish the calculation process shown in FIG. 5 within a certain time period because the charge or discharge of the secondary battery on the system must be stopped during the process as shown in FIG. 5.

The basic flow of the calculation process in this altered embodiment is similar to the flowchart shown in FIG. 5. However in the Step S12 shown in FIG. 5, it is necessary to wait to start measuring the sampling voltage values for the predetermined standby time of voltage measurement after termination of charge or discharge. And it is possible to execute the calculation with a quartic exponential damping function without some predetermined terms when the process of the step S13 or later is executed with the sampling voltage values obtained in the voltage measurement which starts after the standby time of voltage measurement passes.

In the description for this altered embodiment, a VRLA battery is employed as the secondary battery 10. However, the calculation process in this altered embodiment is also applicable to the other kinds of secondary battery. As the function form of exponential damping function is various due to the kind or characteristics of secondary battery, it is necessary to employ the optimum process depending on respective function forms.

As described above, in this embodiment, the quartic or more exponential damping function is employed to approximate the time characteristics of the open circuit voltage of the secondary battery. However, it is possible to use all together such other function as polynomial function along with the quartic or more exponential damping function.

In this embodiment, it is possible to employ a quartic exponential damping function with ten coefficients of A1 through A10 like the following formula (31) besides that with the nine coefficients of A1 through A9 shown in the formula (15).

$$F(T) = A1\exp(A5 \cdot T) + A2\exp(A6 \cdot T) + A3\exp(A7 \cdot T) + \\ A4\exp(A8 \cdot T) - A9 \cdot T + A10 | \quad (31)$$

In the above formula (31), the term of $-A9 \cdot T$ is taken into account. This term is added in order to take the time characteristics into account in the case that the electric current having a predetermined value is supplied from the secondary battery 10 on termination of charge to such as the control part 13 or the storage part 14.

In the above embodiments, there is described the power supply system for vehicle to calculate charged rate of a secondary battery for backup or power supply in various equipments, or of a secondary battery for vehicle mounted in a vehicle. However without restriction to these applications, the present invention is applicable to various types of equipments with at least a secondary battery.

Figure 11:
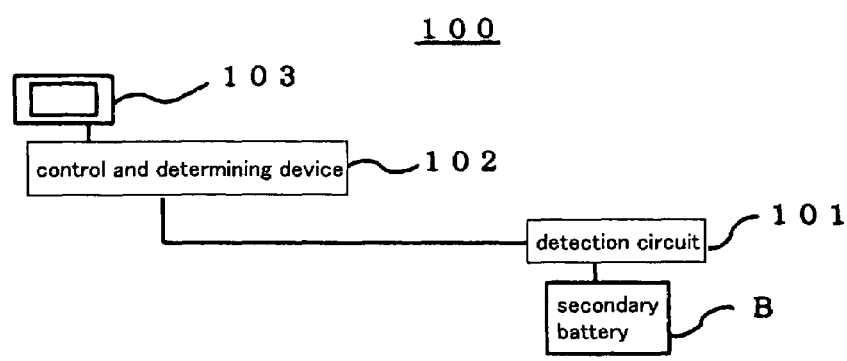
FIG. 11 is a block diagram showing the schematic construction comprising a display part for such as the calculated charged rate in the altered embodiment.

For instance as shown in FIG. 11, the system to determine the state of the secondary battery B from charged rate thereof may comprise the detection circuit 101 to measure current, voltage, resistance and temperature of the secondary battery B, the control and judgment part 102 which calculates the charged rate from the datum measured in the detection circuit 101, and determines the state of the secondary battery based upon the charged rate, and the display part 103 to display the determination results with various types of aspects.

In the above construction, the detection circuit 101 measures current, voltage, resistance and temperature of the secondary battery B, and transmits the measured datum to the control and judgment equipment 102. The control and judgment equipment 102 calculates charged rate from the received datum, and determines the state of the secondary battery B based upon the charged rate. The determination results are displayed with various types of aspects by the display part 103.

Thereby, it is possible for user to comprehend easily the state of the secondary battery B.

In this case, the display part 103 can be constructed so that it displays the state of the secondary battery B such as necessity or nonnecessity of replacement, and moreover the replacement timing recommended due to the necessity of replacement. Furthermore, the display part 103 may be such as a TV monitor, a computer display and a display of GPS equipment in a car navigation system. Alternatively, it is possible to indicate by only sound.

Figure 12:
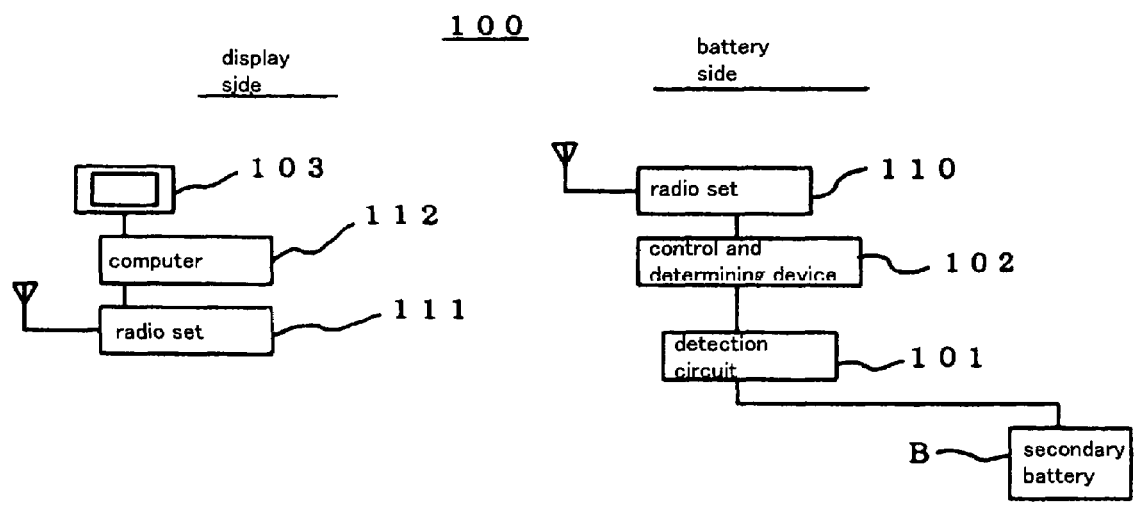
FIG. 12 is a block diagram showing the schematic construction comprising a display part to indicate such as the calculated charged rate which is linked to equipments on a battery side through wireless communication.

Furthermore as shown in FIG. 12, it is also possible to arrange the detection circuit 101 for detecting the state of the secondary battery and the control and judgment equipment 102 for determining the state nearby the secondary battery, and the display part 103 in the desired position.

To be concrete, the detection circuit 101 for detecting the state of the secondary battery and the control and judgment equipment 102 for determining the state nearby the secondary battery are arranged nearby the secondary battery. The control and judgment equipment 102 calculates the charged rate from the datum received from the detection circuit 101, determines the state of the secondary battery based upon the charged rate, and transmits the determination results to the display part 103 via the radio set 110.

And the computer 112 receives the determination results via the radio set 111 arranged nearby the display part 103, and make the display part 103 display the determination results with various types of aspects.

In addition, the control and judgment equipment 102 mustn't be arranged near the secondary battery in FIG. 12. The datum such as temperature, voltage and resistance measured by the detection circuit 101 are transmitted via the radio set 110, and received via the radio set 111 near the display part 103. And the control and judgment equipment 102 or the computer 112 near the display part 103 executes to calculate the charged rate based upon the datum.

The above construction makes it possible to use plural display parts, or monitor or to manage respective secondary batteries with one display part or with plural display parts respectively located on plural places such as secondary battery manufacturer or bases for maintenance. In the case, a serial number or an ID number makes it easy to recognize individually the plural secondary batteries.

In addition along with the wire communication as shown in FIG. 11 and the wireless communication as shown in FIG. 12, such electric datum as texts, graphics or sound including information about charged rate may be available through such as a cell phone or a computer over phone lines or the Internet.

Figure 13:
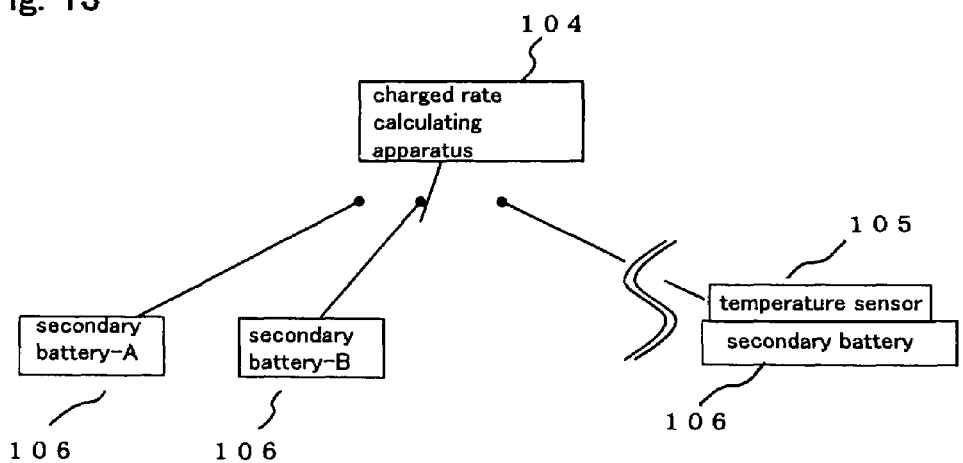
FIG. 13 shows an example in which at least two batteries are measured as an altered embodiment.

In addition, the judgment apparatus of charged rate for a secondary battery according to the other embodiment show in FIG. 13 can switch over the detection circuits respectively equipped with plural secondary batteries located away from each other, and/or determined charged rates of secondary batteries A, B and C by switching over the hookup between the detection circuit equipped with the judgment apparatus and plural secondary batteries. In the case, though such electric parameter as voltage, current and resistance can be measured with the judgment apparatus of charged rate for a secondary battery located away from the secondary battery, it is desired to use temperature sensors arranged near or on the secondary battery as for temperature measurement. The construction like this makes it possible to determine charged rates of plural secondary batteries respectively equipped with observational equipments or communications equipments. In addition, the construction also makes it possible to determine charged rates for at least one of plural secondary batteries mounted in such plural places as under the seats or in storage spaces set up in front or rear section of a vehicle. Furthermore, a judgment apparatus of charged rate for a secondary battery or a computer can take care of plural secondary batteries.

Figure 14:
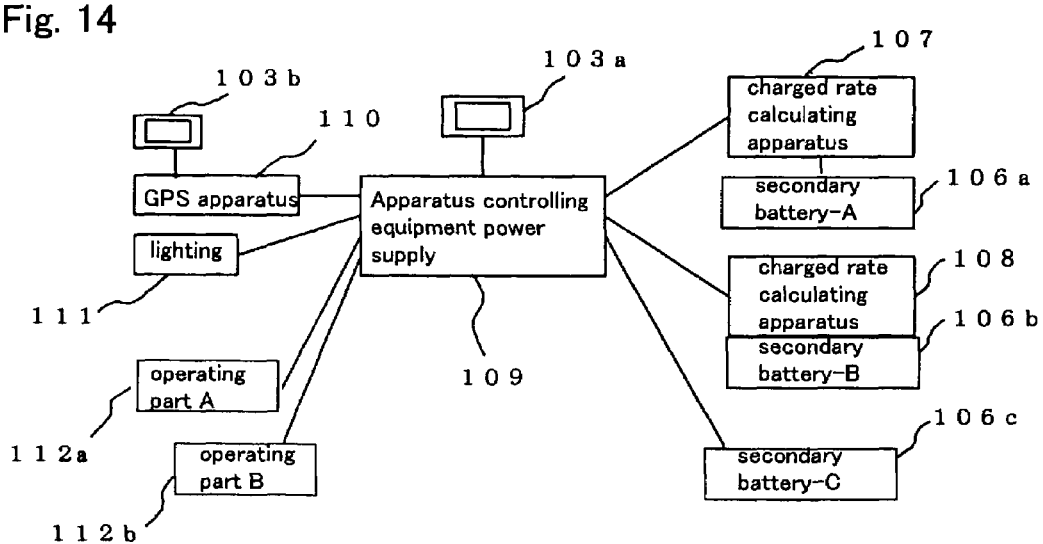
FIG. 14 shows an example in which at least two batteries are managed by one apparatus as an altered embodiment.

In addition, FIG. 14 shows further other embodiments. In the one of those embodiments, an apparatus 107 for calculating charged rate of a secondary battery is located near the secondary battery 106a, and in another, the apparatus for calculating charged rate of a secondary battery 108 is mounted on the secondary battery 106b. In FIG. 14, the determination of the state with charged rate isn't executed for the secondary battery 106c.

As shown in FIG. 14, the GPS (Global Positioning System) apparatus 110, the light 111, the operating parts 112 and etc. are hooked to the equipment controlling power supplies and devices 109. The electric power is supplied and/or controlled by the equipment 109. For instance, there are controlled on/off of the light 111, movement and amount of energy consumption of the operating parts 112. In addition, the GPS apparatus 110 can measure time along with position and height, so it is possible to use the GPS apparatus 110 in order to put right the clock of the equipment controlling power supplies and other equipments and devices. In a system like this, the equipment controlling power supplies and devices 109 takes care of plural secondary batteries and makes the display part 103a display charged rate of a secondary batteries 106a through 106c. Furthermore, the equipment controlling power supply 109, the apparatus for calculating the charged rate of a secondary battery 108 and the computer not shown can transmit or receive information with external equipments, and therefore it is possible to transmit or receive information of determinations for secondary batteries with charged rates thereof with each other, and also install or update the control program.

Moreover, the determination of the charged rate of the plural secondary batteries, which are exchanged or charged at almost the same time, makes it possible to predict the state of the charged rate affected by the load condition or environments or lifetime, and to further inform the user of an expected time for exchange or charge.

Moreover, the present embodiment comprises the display part as shown in FIG. 11 or FIG. 12, the storage part (not shown) to store the history record of the secondary battery, and the control and judgment equipment, such as the power control apparatus 5 and the apparatus for calculating charged rate of a secondary battery 6 in FIG. 2, having programs to continuously determine and/or to store such a history record of the secondary battery in which the secondary battery is used continuously or after charged, and makes it possible to determine the level of charged rate of the secondary battery.

Thus, the system of the invention as described above makes it possible to keep at least one of plural secondary batteries under the condition of being usable at any time. The present invention may therefore be effectively applied to systems or equipments to which the electric power is required to be supplied at any time

What is claimed is:

1. A method for calculating charged rate of a secondary battery which is adapted to supply electric power to a load, comprising the steps of:

providing a time function for the open circuit voltage of the secondary battery as a function of time with its coefficients undetermined;

measuring voltage samples of the open circuit voltage of the secondary battery at a plurality of different time points within a predetermined period of time after termination of charge or discharge to obtain plural measured voltage samples along time axis;

using the plural measured voltage samples to determine the coefficients of the time function to thereby determine the time function;

calculating a convergent value of the open circuit voltage of the secondary battery based on the determined time function; and calculating the charged rate based on the convergent value of the open circuit voltage;

wherein the step of providing the time function comprises providing a combination of at least two exponential decay functions in which the combination of N exponential decay functions, hereinafter referred to as multi-exponential decay function, where N is an integer of at least two is given by $$Y = a1\ \exp(-b1 \cdot X) + a2\ \exp(-b2 \cdot X) + a3\ \exp(-b3 \cdot X) + a4\ \exp(-b4 \cdot X) + \ldots + an\ \exp(-bn \cdot X) + c$$

wherein (2N+1) coefficients a1 to an, b1 to bn and c are undetermined, Y denotes the open circuit voltage, and X denotes time; and wherein the step of using the plural measured voltage samples comprises using the measured voltage samples to determine the (2N+1) coefficients to determine the multi-exponential decay function.

2. The method for calculating the charged rate as claimed in claim 1, wherein predetermined exponential decay terms included in the multi-exponential decay function are removed in correspondence to a standby time of measuring the plural measured voltage samples along the time axis to calculate the convergent value of the open circuit voltage of the secondary battery.

3. The method for calculating the charged rate as claimed in claim 1, wherein the multi-exponential decay function is the function with time T as described below in the formula (1) which has five coefficients of A1, A2, A5, A6 and C:

$$F(T) = A1\ \exp(A5 \cdot T) + A2\ \exp(A6 \cdot T) + c \quad (1)$$

wherein F(T) denotes the open circuit voltage.

4. The method for calculating the charged rate as claimed in claim 1, wherein the multi-exponential decay function is the function with time T as described below in the formula (2) which has nine coefficients of A1 to A9:

$$F(T) = A1\exp(A5 \cdot T) + A2\exp(A6 \cdot T) + A3\exp(A7 \cdot T) + A4\exp(A8 \cdot T) + A9. \quad (2)$$

5. The method for calculating the charged rate as claimed in claim 4, wherein the formula (3) mentioned below is used in place of the function F(T) of the formula (2) when the standby time of voltage measurement is more than or equal to a predetermined first time and less than a predetermined second time, the formula (4) mentioned below is used in place of the function F(T) of the formula (2) when the standby time of voltage measurement is more than or equal to the predetermined second time and less than a predetermined third time, and the formula (5) mentioned below is used in place of the function F(T) of the formula (2) when the standby time of voltage measurement is more than or equal to the predetermined third time:

$$F(T)=A2\ \exp(A6 \cdot T)+A3\ \exp(A7 \cdot T)+A4\ \exp(A8 \cdot T)+A9 \quad (3)$$

$$F(T)=A3\ \exp(A7 \cdot T)+A4\ \exp(A8 \cdot T)+A9 \quad (4)$$

$$F(T)=A4\ \exp(A8 \cdot T)+A9. \quad (5)$$

6. The method for calculating the charged rate as claimed in claim 1, wherein the charged rate of at least one of two or more secondary batteries is calculated.

7. The method for calculating the charged rate as claimed in claim 1, wherein the charged rates of at least two secondary batteries are calculated; and a display function which displays the charged rates of the secondary batteries and/or the determination of charge or replacement on each of the secondary batteries, or determination of ongoing use or not on the same, a storage function which records history of an individual battery, and a control and judgment function with a program to record the history of the determination and/or to determine repeatedly are included.

8. An apparatus of calculating charged rate of a secondary battery which is adapted to supply a load with electrical power, comprising:

a voltage sensor to measure voltage samples indicative of an open circuit voltage of the secondary battery at a plurality of different time points within a predetermined period of time after termination of charging or discharging;

a control unit to receive the measured voltage samples from the voltage sensor to calculate the charged rate;

wherein the control unit comprises:

a providing means for providing a combination of at least two exponential decay functions in which the combination of N exponential decay functions, hereinafter referred to as multi-exponential decay function, where N is an integer of at least two is given by $$Y = a1\ \exp(-b1 \cdot X) + a2\ \exp(-b2 \cdot X) + a3\ \exp(-b3 \cdot X) + a4\ \exp(-b4 \cdot X) + \ldots + an\ \exp(-bn \cdot X) + c$$

wherein (2N+1) coefficients a1 to an, b1 to bn and c are undetermined, Y denotes the open circuit voltage, and X denotes time;

a function determining means for using the measured voltage samples to determine the coefficients of the multi-exponential decay function to thereby determine the multi-exponential decay function; and a charge determining means for calculating the charged rate of the secondary battery using at least the determined multi-exponential decay function, the charge determining means including means for determining a convergent value of the open circuit voltage using the determined multi-exponential decay function, and for calculating the charge rate using the determined convergent value of the open circuit voltage.

9. The apparatus of calculating charged rate as claimed in claim 8, wherein the control unit further comprises means for simplifying the multi-exponential decay function by removing a predetermined term in the multi-exponential decay function depending on a standby time of voltage measurement which is an elapsed time from termination of charge or discharge to starting to measure voltage, and means for applying the measured voltage samples to the simplified exponential decay function to determine its coefficients to determine the simplified exponential decay function in order that the convergent value of the open circuit voltage of the secondary battery may be calculated from the determined simplified exponential decay function.

10. The apparatus of calculating charged rate as claimed in claim 8, wherein the multi-exponential decay function has five coefficients A1, A2, A5, A6 and C and is given by the formula (6):

$$F(T)=A1\exp(A5 \cdot T)+A2\exp(A6 \cdot T)+c \qquad (6)$$

wherein T denotes time and F(T) denotes the open circuit voltage.

11. The apparatus of calculating charged rate as claimed in claim 8, wherein multi-exponential decay function has nine coefficients A1 to A9 and is given by the formula (7):

$$F(T) = A1\exp(A5 \cdot T) + A2\exp(A6 \cdot T) + A3\exp(A7 \cdot T) + A4\exp(A8 \cdot T) + A9. \qquad (7)$$

wherein T denotes time and F(T) denotes the open circuit voltage.

12. The apparatus of calculating charged rate as claimed in claim 11, wherein the formula (8) mentioned below is used in place of the function F(T) of the formula (7) when the standby time of voltage measurement, which is the time from termination of charge or discharge for the secondary battery to starting the voltage measurement, is more than or equal to a predetermined first time and less than a predetermined second time, the formula (9) mentioned below is used in place of the function F(T) of the formula (7) when the standby time of voltage measurement is more than or equal to the predetermined second time and less than a predetermined third time, and the formula (10) mentioned below is used in place of the function F(T) of the formula (7) when the standby time of voltage measurement is more than or equal to the predetermined third time:

$$F(T)=A2\exp(A6 \cdot T)+A3\exp(A7 \cdot T)+A4\exp(A8 \cdot T)+A9 \qquad (8)$$

$$F(T)=A3\exp(A7 \cdot T)+A4\exp(A8 \cdot T)+A9 \qquad (9)$$

$$F(T)=A4\exp(A8 \cdot T)+A9 \qquad (10).$$

13. The apparatus of calculating charged rate as claimed in claim 8, wherein the charged rate is calculated for at least one of two or more batteries.

14. The apparatus of calculating charged rate as claimed in claim 8, wherein the charged rates of at least two secondary batteries are calculated, and the apparatus comprises a display part which displays the charged rates of the secondary batteries and/or the determination of charge or replacement on each of the secondary batteries, or of ongoing use or not on the same, a storage part which records the histories of the individual batteries, and a control and judgment part with a program to record the histories of the determinations and/or to determine repeatedly.

15. A power supply system with secondary battery comprising the apparatus of calculating charged rate as claimed in claim 8.

16. The power supply system for vehicle with secondary battery as claimed in claim 15, wherein the secondary battery is an automotive battery to supply loads on a vehicle with electric power.

* * * * *